(12) United States Patent
Na

(10) Patent No.: US 8,829,960 B2
(45) Date of Patent: Sep. 9, 2014

(54) DELAY LOCKED LOOP CIRCUIT AND METHOD OF DRIVING THE SAME

(71) Applicant: SK Hynix, Inc., Gyeonggi-do (KR)

(72) Inventor: Kwang-Jin Na, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/686,592

(22) Filed: Nov. 27, 2012

(65) Prior Publication Data

US 2014/0021990 A1   Jan. 23, 2014

(30) Foreign Application Priority Data

Jul. 19, 2012   (KR) .................. 10-2012-0078808

(51) Int. Cl.
*H03L 7/06*   (2006.01)

(52) U.S. Cl.
USPC .......................................... 327/158; 327/149

(58) Field of Classification Search
None
See application file for complete search history.

(56) References Cited

U.S. PATENT DOCUMENTS

| | | | | |
|---|---|---|---|---|
| 8,446,199 B2* | 5/2013 | Shim et al. | ..................... | 327/175 |
| 2010/0213995 A1* | 8/2010 | Lee | .................. | 327/158 |
| 2011/0058437 A1* | 3/2011 | Miyano | .................. | 365/222 |
| 2011/0074479 A1* | 3/2011 | Yun et al. | ..................... | 327/158 |
| 2011/0109367 A1* | 5/2011 | Ma | .................. | 327/158 |
| 2011/0227619 A1* | 9/2011 | Kitagawa | ..................... | 327/158 |
| 2011/0234280 A1* | 9/2011 | Na | .................. | 327/158 |
| 2014/0002155 A1* | 1/2014 | Park et al. | ..................... | 327/158 |

FOREIGN PATENT DOCUMENTS

| | | |
|---|---|---|
| KR | 1020050089474 | 9/2005 |
| KR | 10-0810073 | 2/2008 |
| KR | 1020100096917 | 9/2010 |
| KR | 1020110076672 | 7/2011 |

* cited by examiner

Primary Examiner — Cassandra Cox
(74) Attorney, Agent, or Firm — IP & T Group LLP

(57) ABSTRACT

The DLL comprises a coarse delay line configured to have a plurality of unit delays and delay an reference dock to output a delayed clock, a fine delay line configured to delay the delayed clock to output a delayed output clock, a replica delay unit configured to delay the delayed output clock by an expected modeling value to output a feedback clock, a phase detection unit configured to compare a phase of the feedback clock with a phase of the reference clock to generate first to third phase detection signals based on a result of the comparison, a locking detection unit configured to output a locking signal by selecting a first locking detection signal or a second locking detection signal, and a control unit configured to control the coarse and fine delay lines in response to the locking signal and the first phase detection signal.

20 Claims, 9 Drawing Sheets

DELAY LOCKED LOOP CIRCUIT AND METHOD OF DRIVING THE SAME

CROSS-REFERENCE TO RELATED APPLICATIONS

The present application claims priority of Korean Patent Application No. 10-2012-0078808, filed on Jul. 19, 2012, which is incorporated herein by reference in its entirety.

BACKGROUND

1. Field

Exemplary embodiments of the present invention relate to semiconductor design technology, and more particularly, to a Delay-Locked Loop (DLL) circuit for a semiconductor device and a method of driving the same.

2. Description of the Related Art

In general, a DLL circuit is used to provide a delay locked clock having a phase, which is earlier than the phase of an internal clock by a specific time, obtained by converting an external clock. An internal clock used in a semiconductor integrated circuit is delayed through a clock buffer and transmission lines, and thus, a phase difference occurs between the internal clock and an external clock. A DLL circuit may be used to solve concerns in which the output timing of output data is not synchronized due to the phase difference.

FIG. 1 is a waveform diagram illustrating the operation of a conventional DLL circuit.

As shown in FIG. 1, the DLL circuit outputs a delay locked clock signal DLL_OUT having a timing that is earlier than a timing of a received internal clock INT_CLK by a specific time. A semiconductor memory device synchronizes data D0, D1, and D2 with the delay locked clock signal DLL_OUT and outputs the synchronized data. When the semiconductor memory device outputs the data as described above, the data seems to be precisely outputted in response to an external signal EXT_CLK.

When the DLL circuit completes the delay locked operation, a locking detector detects this completion and activates a locking detection signal. When the locking detector activates the locking detection signal, the semiconductor memory device externally outputs data synchronized with a transition of a delay locked clock that is outputted from the DLL circuit.

If the locking detector determines that a delay locked operation has been completed even when the delay locked operation has not been completed, and thus, activates a locking detection signal, the semiconductor memory device erroneously detects that the delay locked operation has been completed and outputs data externally. In this case, the output data may not be synchronized with an external system clock.

Furthermore, a delay locked operation may not be completed because a locking detection signal is not activated when the delay locked operation is completed. Even in this case, the output data may not be synchronized with an external system dock. As a result, an external device may not properly receive data outputted from a semiconductor memory device,

SUMMARY

Exemplary embodiments of the present invention are directed to providing a DLL capable of detecting delay locking in an initial delay locking operation without an error.

Other exemplary embodiments of the present invention are directed to providing a DLL that may prevent a half phase locking failure in which a coarse delay lock signal is generated in a half phase due to the introduction of power noise in the initial locking process of the DLL used in a semiconductor device and prevent a phase locking miss in which delay locking is missed in a phase-locked position.

In accordance with an embodiment of the present invention, a DLL includes a coarse delay line configured to have a plurality of unit delay and delay an reference clock to output a delayed clock; a fine delay line configured to delay the delayed clock to output a delayed output clock; a replica delay unit configured to delay the delayed output clock by an expected modeling value to output a feedback clock; a phase detection unit configured to compare a phase of the feedback clock with a phase of the reference clock to generate a first phase detection signal based on a result of the comparison, compare the phase of the reference clock with a phase of the feedback clock delayed by the unit delay to generate a second phase detection signal based on a result of the comparison, and compare the phase of the reference clock with a phase of the feedback clock advanced by the unit delay to generate a third phase detection signal based on a result of the comparison; a locking detection unit configured to output a locking signal by selecting a first locking detection signal generated by comparing a previous state and a current state of the second phase detection signal with each other or a second locking detection signal generated in response to logic levels of the first to third phase detection signals at the same timing; and a control unit configured to control the coarse delay line and the fine delay line in response to the locking signal and the first phase detection signal.

In accordance with another embodiment of the present invention, a DLL includes a variable delay unit configured to comprise a plurality of unit delays to delay a reference clock; a replica delay unit configured to delay an output clock of the variable delay unit by an expected modeling value to output a feedback clock; a first phase detection unit configured to compare a phase of the reference clock with a phase of the feedback clock to generate a first phase detection signal based on a result of the comparison; a second phase detection unit configured to compare the phase of the reference clock with a phase of the feedback clock delayed by a unit delay of the variable delay unit to generate a second phase detection signal according to a result of the comparison; a third phase detection unit configured to compare a phase of the reference clock delayed by the unit delay with the phase of the feedback clock to generate a third phase detection signal based on a result of the comparison; a first locking detection unit configured to generate a first locking detection signal by detecting a transition of the second phase detection signal; a second locking detection unit configured to generate a second locking detection signal in response to logic levels of the second and the third phase detection signals corresponding to a logic level of the first phase detection signal; a selection unit configured to output the first locking detection signal or the second locking detection signal as a final locking signal in response to a selection signal generated when the first to third phase detection signals satisfy a specific condition; and a delay control unit configured to control an amount of delay of the variable delay unit in response to the final locking signal and the first phase detection signal.

In accordance with yet another embodiment of the present invention, a method of driving a DLL includes delaying an reference clock by a coarse delay amount; delaying the delayed reference clock by a fine delay amount to output an output clock; delaying the output clock by an expected modeling value and outputting a feedback clock; comparing a phase of the reference clock with a phase of the feedback clock to generate a first phase detection signal based on a result of the comparison comparing the phase of the reference dock with a phase of the feedback dock delayed by a unit delay amount of the coarse delaying to generate a second phase detection signal based on a result of the comparison, and comparing the phase of the reference clock with a phase of the feedback clock advanced by the unit delay amount of the coarse delaying to generate a third phase detection signal based on a result of the comparison; generating a first locking detection signal by detecting a transition of the second phase detection signal, and generating a second locking detection in response to logic levels of the second and the third phase detection signals; selecting one of the first locking detection signal and the second locking detection signal in response to a selection signal to output a locking signal; and controlling delay amounts of the coarse and fine delays in response to the locking signal and the first phase detection signal.

DETAILED DESCRIPTION

Figure 1:
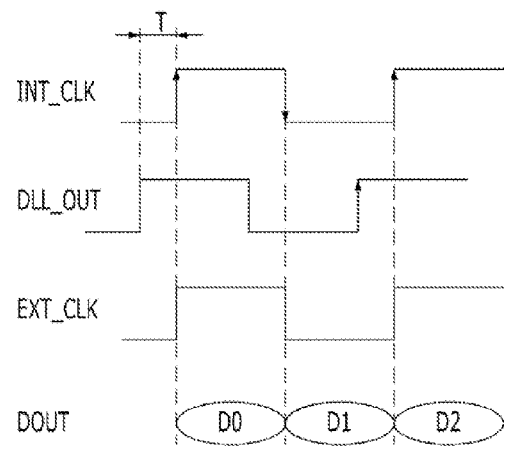
FIG. 1 is a waveform diagram illustrating an operation of a conventional DLL circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
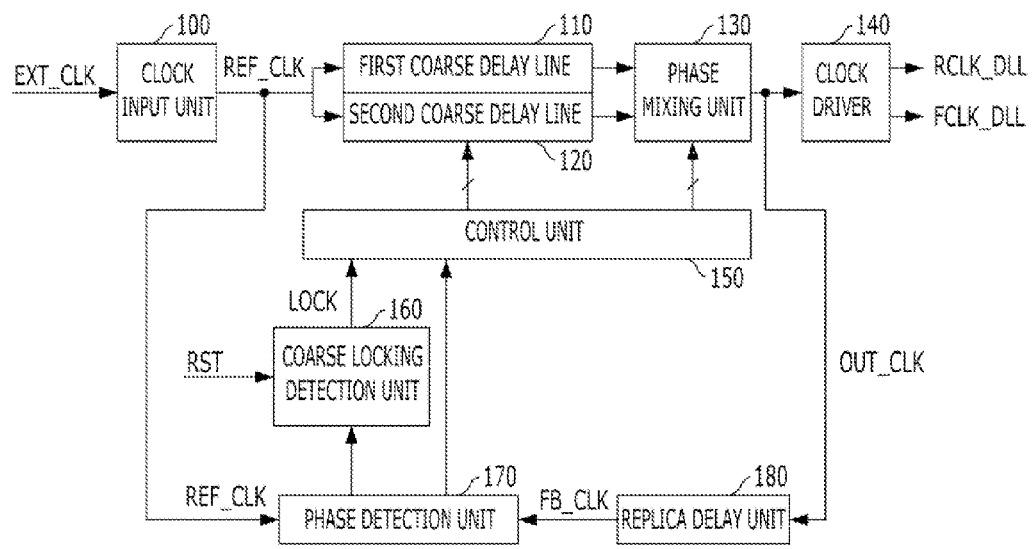
FIG. 2 is a block diagram of a DLL circuit.

FIG. 2 is a block diagram of a DLL circuit for illustrating the present invention.

Referring to FIG. 2, the DLL circuit includes a clock input unit 100 first and second coarse delay lines 110 and 120, a phase mixing unit 130, a clock driver 140, a control unit 150, a coarse locking detection unit 160, a phase detection unit 170, and a replica delay unit 180.

The clock input unit 100 is configured to receive an external clock EXT_CLK as an input to output a reference clock REF_CLK. The coarse delay lines 110 and 120 coarsely delay the reference clock REF_CLK under the control of the control unit 150 to output the delayed clocks. The phase mixing unit 130 mixes the delayed clocks of the coarse delay lines 110 and 120 under the control of the control unit 150 to output the mixed clock OUT_CLK. The clock driver 140 outputs delay locked clocks RCLK_DLL and FCLK_DLL using the mixed clock OUT_CLK received from the phase mixing unit 130. The replica delay unit 180 delays the mixed clock OUT_CLK by a predetermined delay value to output a feedback clock FB_CLK. The predetermined delay value of the replica delay unit 180 is obtained by modeling a delay time for a clock signal to reach a data output buffer for outputting data after the clock signal is inputted to a semiconductor device.

The phase detection unit 170 compares a phase of the feedback clock FB_CLK with a phase of the reference clock REF_CLK to output control signals based on a result of the comparison. The coarse locking detection unit 160 outputs a locking signal LOCK in response to some of the control signals outputted from the phase detection unit 170. The control unit 150 controls the coarse delay lines 110 and 120 and the phase mixing unit 130 using the locking signal LOCK outputted from the coarse locking detection unit 160 and some of the control signals outputted from the phase detection unit 170. When the locking signal LOCK is activated, the coarse delay lines 110 and 120 stop the coarse delay operations, and the phase mixing unit 130 starts the fine delay operation.

As described above, the DLL circuit includes the coarse delay lines 110 and 120 for performing coarse delay operations and the phase mixing unit 130 for performing a fine delay operation in order to improve a jitter characteristic. Each of the coarse delay lines includes a plurality of unit delays in a chain form, and the number of unit delays used in each of the coarse delay lines for coarse delay operations is determined under the control of the control unit 150.

Figure 3:
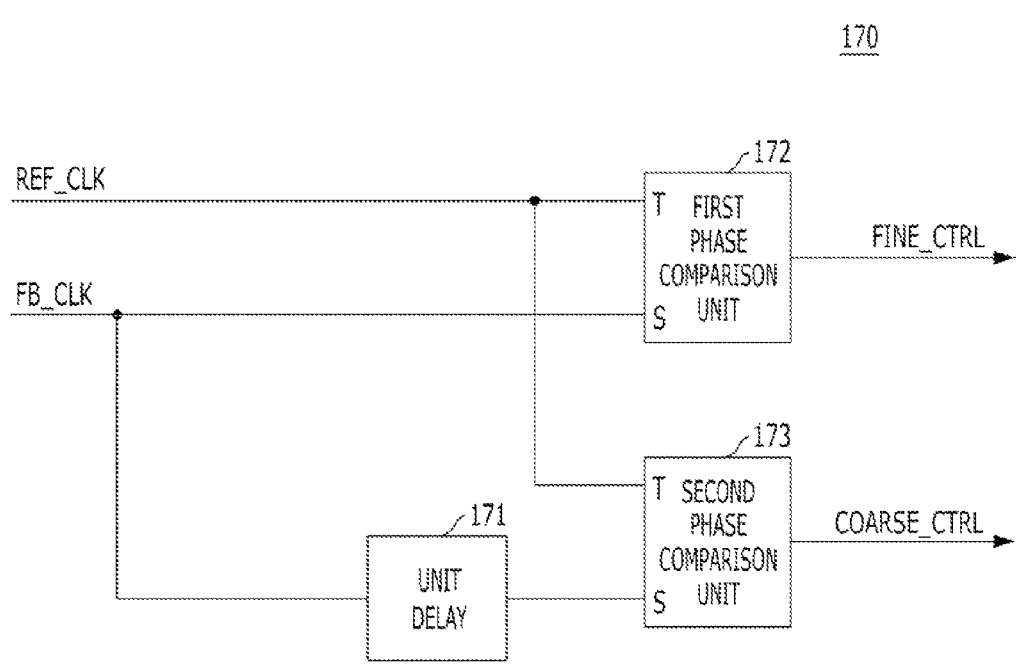
FIG. 3 is a block diagram of a phase detection unit shown in FIG. 2.

FIG. 3 is a block diagram of the phase detection unit 170 shown in FIG. 2.

Referring to FIG. 3, the phase detection unit 170 includes a unit delay 171, first phase comparison unit 172 and second phase comparison unit 173.

The unit delay 171 delays the feedback clock FB_CLK by a unit delay of the coarse delay lines 110 and 120. The first phase comparison unit 172 compares the phase of the feedback clock FB_CLK with the phase of the reference clock REF_CLK and outputs a fine control signal FINE_CTRL according to a result of the comparison. The second phase comparison unit 173 compares a phase of an output clock signal of the unit delay 171 with the phase of the reference clock REF_CLK and outputs a coarse control signal COARSE_CTRL according to a result of the comparison.

The phase detection unit 170 detects the position of phase of the feedback clock FB_CLK relative to the phase of the reference clock REF_CLK. For example, if the transition timing of the feedback clock FB_CLK is placed at the high level of the reference clock REF_CLK, the phase detection unit 170 outputs the coarse control signal COARSE_CTRL of a logic high level. If the transition timing of the feedback dock FB_CLK is placed at the low level of the reference clock REF_CLK, the phase detection unit 170 outputs the coarse control signal COARSE_CTRL of a logic low level.

Figure 4:
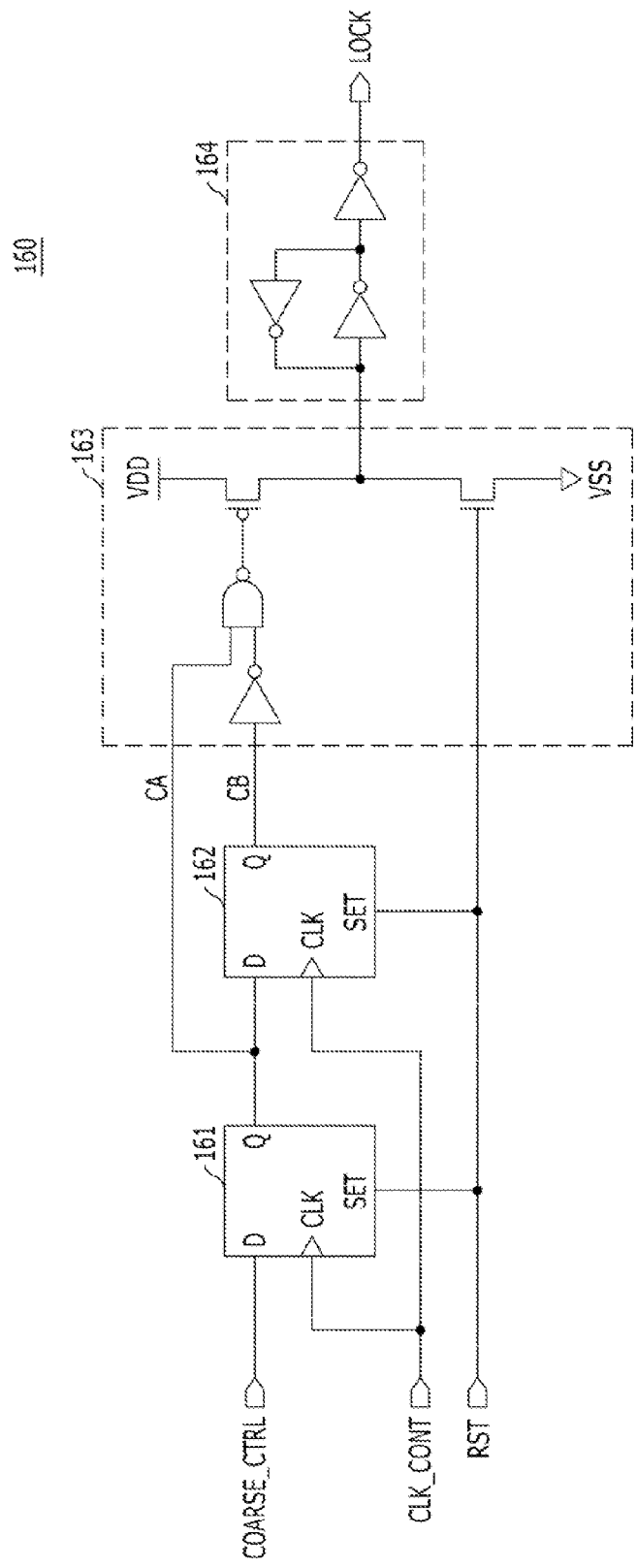
FIG. 4 is a detailed circuit diagram of a coarse locking detection unit shown in FIG. 2 and connected to the phase detection unit of FIG. 3.

FIG. 4 is a detailed circuit diagram of the coarse locking detection unit 160 shown in FIG. 2 and connected to the phase detection unit of FIG. 3.

Referring to FIG. 4, the coarse locking detection unit 160 includes a first flip-flop 161 and a second flip-flop 162 (hereinafter collectively referred to as first and second flip-flops 161 and 162), a signal combination unit 163 and a locking signal output unit 164.

The first and the second flip-flops 161 and 162 output the coarse control signal COARSE_CTRL as a first coarse signal CA and a second coarse signal CB, respectively, which are synchronized with a clock signal CLK_CONT. For reference, the clock signal CLK_CONT may be a clock obtained by dividing the external clock EXT_CLK by about 4 to 20 divisions and may be used to synchronize the control operation of the DLL circuit. The signal combination unit 163 outputs a signal indicative of a locking state in response to the first and the second coarse signals CA and CB. The locking signal output unit 164 latches an output signal of the signal combination unit 163 and outputs the locking signal LOCK. For reference, the first and second flip-flops 161 and 162 and the signal combination unit 163 may be reset by a reset signal RST for resetting a delay locked operation.

When the coarse control signal COARSE_CTRL of a logic high level is outputted at the transition timing of the clock signal CLK_CONT, the coarse locking detection unit 160 activates the locking signal LOCK as a pulse signal. Accordingly, the coarse locking detection unit 160 compares a current state with a previous state of the coarse control signal COARSE_CTRL and generates the locking signal LOCK based on a result of the comparison. Therefore, the coarse locking detection unit 160 informs a point of time at which a coarse delay operation will be finished.

Figure 5:
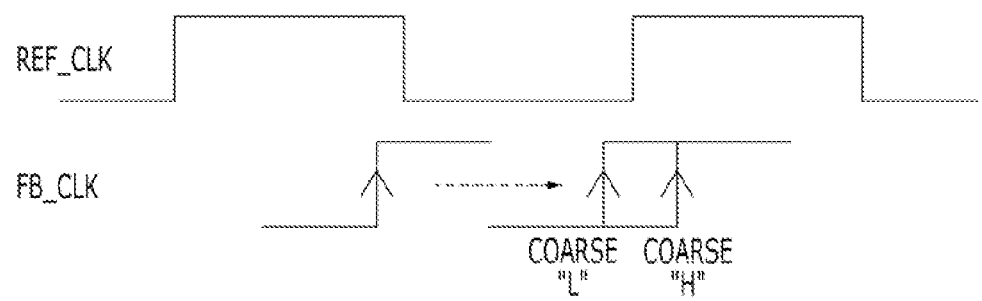
FIG. 5 is a waveform diagram illustrating an operation of the DLL circuit shown in FIGS. 2 to 4.

FIG. 5 is a waveform illustrating an operation of the DLL circuit shown in FIGS. 2 to 4, and FIG. 6 is a waveform diagram illustrating concerns in the operation of the DLL circuit shown in FIGS. 2 to 4.

Referring to FIG. 5, when the DLL circuit starts operating, at the early stage of the operation, the coarse delay lines 110 and 120 align the phases of the feedback clock FB_CLK and the reference clock REF_CLK by performing coarse delay operations so that the phase of the feedback clock FB_CLK is close to the phase of the reference clock REF_CLK. The phase detection unit 170 compares the phase of the feedback clock FB_CLK with the phase of the reference clock REF_CLK and outputs the coarse control signal COARSE_CTRL based on a result of the comparison. For example, if the transition timing of the feedback clock FB_CLK is placed at the high level of the reference clock REF_CLK, the phase detection unit 170 outputs the coarse control signal COARSE_CTRL of a logic high level. The coarse locking detection unit 160 activates the locking signal LOCK in response to the coarse control signal COARSE_CTRL.

In response to the activated locking signal LOCK, the coarse delay operations of the coarse delay lines 110 and 120 are terminated and the fine delay operation of the phase mixing unit 130 is performed.

Figure 6:
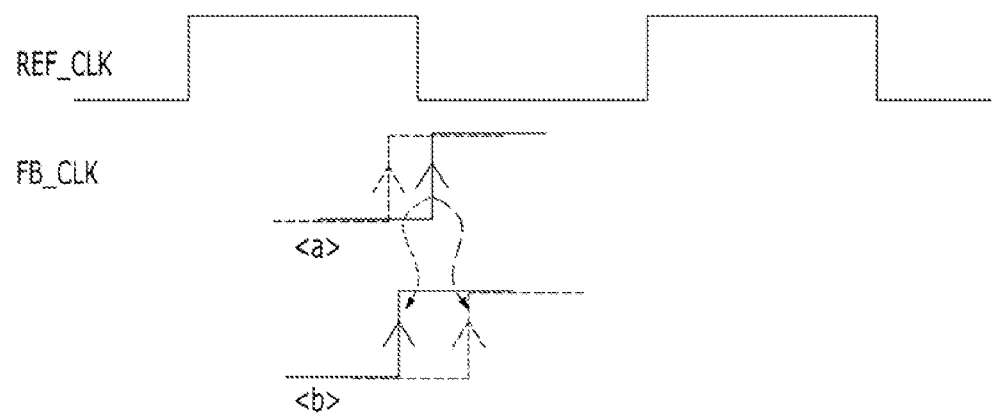
FIG. 6 is a waveform diagram illustrating concerns in the operation of the DLL circuit shown in FIGS. 2 to 4.

If noise due to a shift in a power source voltage is inputted to the DLL circuit, the feedback clock FB_CLK that should be placed in a position indicated by a dotted line is placed in a position indicated by a solid line (see "<a>" of FIG. 6). At this time, the phase detection unit 170 compares the feedback clock FB_CLK, placed in the position of the solid line, with the reference clock REF_CLK and outputs the coarse control signal COARSE_CTRL of a logic low level.

Furthermore, if the feedback clock FB_CLK is delayed by the coarse delay lines 110 and 120 and placed in the position of the solid line due to an unstable power state although it should be placed in the position of the dotted line, the phase detection unit 170 compares the phase of the feedback clock FB_CLK with the phase of the reference clock REF_CLK (see "<b>" of FIG. 6). In this case, even though the locking signal LOCK should not be activated in a high level, the locking signal LOCK is activated in a high level due to noise resulting from a shift in a power source voltage.

If the locking signal LOCK is activated in a high level in an erroneous state as described above, the delay value of a fine delay is adjusted, resulting in a half phase locking failure in which the DLL circuit erroneously determines the state as the final locking state.

Accordingly, to prevent the half phase locking failure due to power noise or a jitter component, a DLL circuit in which the coarse locking detection unit 160 detects a result of the comparison of the phase detection unit 170 at the same point of time without comparing a previous state and a current state was proposed.

Figure 7:
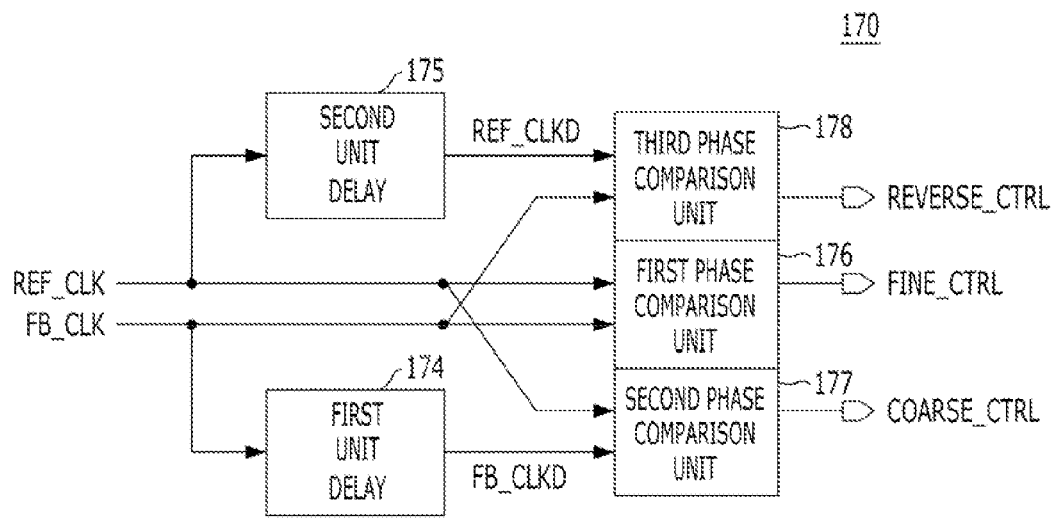
FIG. 7 is another block diagram of the phase detection unit shown in FIG. 2.

FIG. 7 is another block diagram of the phase detection unit 170 shown in FIG. 2.

Referring to FIG. 7, the phase detection unit 170 includes first unit delay 174, second unit delay 175 first phase comparison unit 176, second phase comparison unit 177, and third phase comparison units 178.

The first unit delay 174 delays the feedback clock FB_CLK by a unit delay value of the first and second coarse delay lines 110 and 120 to output a delayed feedback clock FB_CLKD. The second unit delay 175 delays the reference clock REF_CLK by the unit delay value of the first and second coarse delay lines 110 and 120 to output a delayed reference clock REF_CLKD. Here, each of the first and the second unit delays 174 and 175 delays a received clock by the unit delay value of the first and second coarse delay lines 110 and 120, but a delayed value may change in response to the operating environment of a semiconductor memory device.

The first phase comparison unit 176 compares the phase of the feedback clock FB_CLK with the phase of the reference clock REF_CLK and outputs a fine control signal FINE_CTRL based on a result of the comparison. The second phase comparison unit 177 compares a phase of the delayed feedback clock FB_CLKD with the phase of the reference clock REF_CLK and outputs a first coarse control signal COARSE_CTRL based on a result of the comparison. The third phase comparison unit 178 compares a phase of the delayed reference clock REF_CLKD with the phase of the feedback clock FB_CLK and outputs a second coarse control signal REVERSE_CTRL based on a result of the comparison.

The second phase comparison unit 177 receives the reference clock REF_CLK without changes and the delayed feedback clock FB_CLKD and compares the phases of the reference dock REF_CLK with the delayed feedback clock FB_CLKD. Accordingly, the second phase comparison unit 177 generates an effect in which the reference clock REF_CLK seems to have been relatively advanced. In other words, the reference clock REF_CLK may not be advanced, but there is an effect in which the feedback clock FB_CLK seems to have been advanced by delaying the reference clock REF_CLK.

Figure 8:
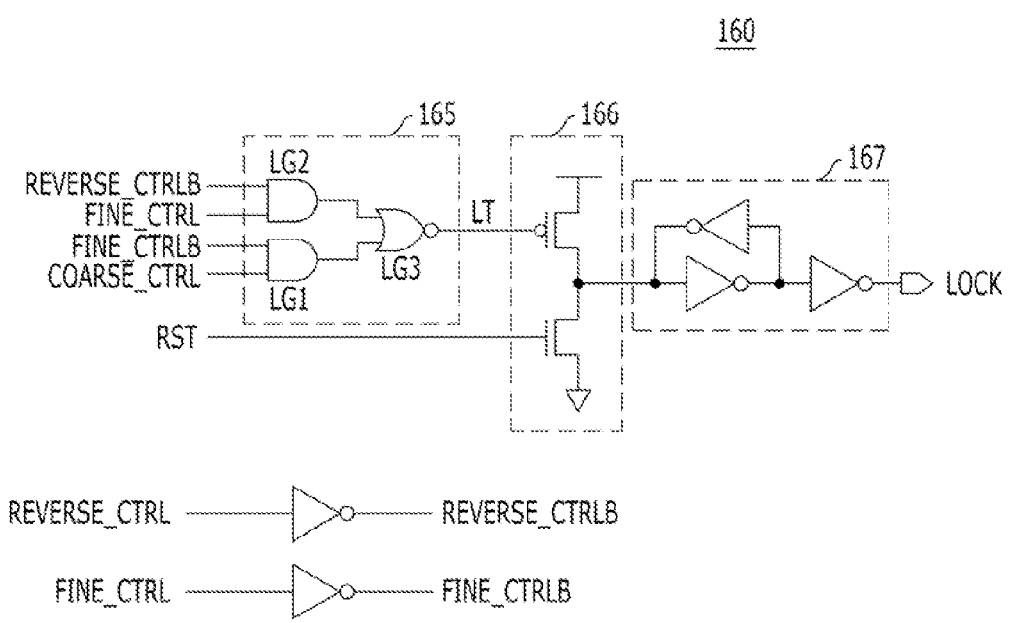
FIG. 8 is another block diagram of the coarse locking detection unit shown in FIG. 2 and connected to the phase detection unit of FIG. 7.

FIG. 8 is another block diagram of the coarse locking detection unit 160 shown in FIG. 2 and connected to the phase detection unit of FIG. 7.

Referring to FIG. 8, the coarse locking detection unit 160 includes a signal input unit 165, a signal driving unit 166, and a locking signal output unit 167.

The signal input unit 165 outputs locking state transfer signal LT in response to logic levels of the first coarse control signal COARSE_CTRL, the second coarse control signal REVERSE_CTRL, and the fine control signal FINE_CTRL. The signal driving unit 166 outputs a signal that informs the locking state in response to the locking state transfer signal LT. The locking signal output unit 167 latches the signal outputted from the signal driving unit 166 and outputs the latched signal as the locking signal LOCK. For reference, the signal driving unit 166 may be reset by a reset signal RST for resetting a delay locked operation.

More particularly, the signal input unit 165 includes a first logic gate LG1 for receiving an inverted fine control signal FINE_CIRLB and the first coarse control signal COARSE_CTRL, a second logic gate LG2 for receiving the fine control signal FINE_CTRL and an inverted second coarse control signal REVERSE_CTRLB, and a third logic gate LG3 for outputting the locking state transfer signal LT by performing logic operation on the output signals of the first logic gate LG1 and the second logic gate LG2. Preferably, each of the first and the second logic gates LG1 and LG2 may be formed of an AND gate, and the third logic gate LG3 may be formed of a NOR gate.

The coarse locking detection unit 160 activates the locking signal LOCK in response to the logic levels of the first coarse control signal COARSE_CTRL and the second coarse control signal REVERSE_CTRL (hereinafter referred to as first and second coarse control signals) corresponding to the logic level of the fine control signal FINE_CTRL. Accordingly, the coarse locking detection unit 160 generates the locking signal LOCK corresponding to the logic levels of the fine control signal FINE_CTRL and the first and the second coarse control signals COARSE_CTRL and REVERSE_CTRL, thus, being capable of informing a point of time at which a coarse delay operation will be terminated.

Figure 9:
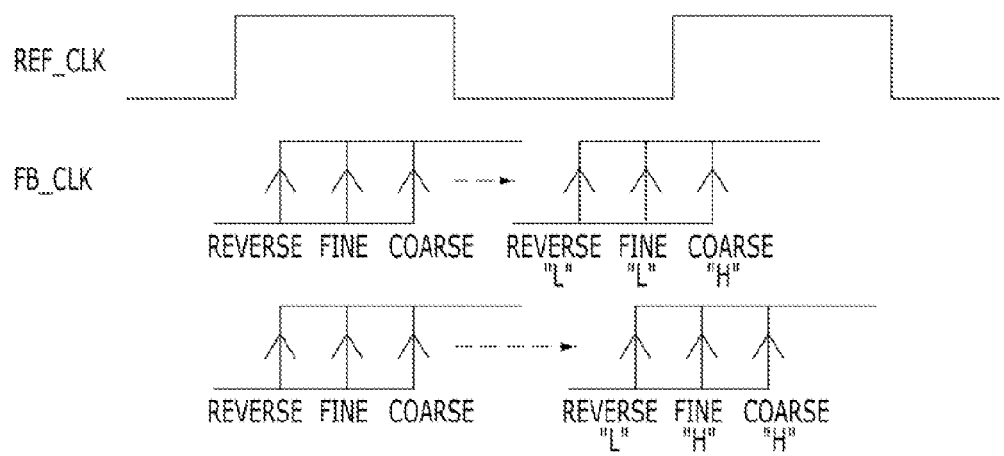
FIG. 9 is a waveform diagram illustrating an operation of the DLL circuit shown in FIGS. 2, 7, and 8.

FIG. 9 is a waveform illustrating an operation of the DLL circuit shown in FIGS. 2, 7, and 8, and FIG. 10 is a waveform diagram illustrating concerns in the operation of the DLL circuit shown in FIGS. 2, 7, and 8.

Referring to FIG. 9, when the DLL circuit starts operating, at the early stage of the operation, the coarse delay lines 110 and 120 align the phases of the feedback clock FB_CLK and the reference clock REF_CLK by performing coarse delay operations such that the phase of the feedback clock FB_CLK is close to the phase of the reference clock REF_CLK. The phase detection unit 170 compares the phase of the feedback clock FB_CLK with the phase of the reference clock REF_CLK and outputs the fine control signal FINE_CTRL and the first and the second coarse control signals COARSE_CTRL and REVERSE_CTRL based on a result of the comparison.

At this time, the coarse locking detection unit 160 activates and outputs the locking signal LOCK when the second coarse control signal REVERSE_CTRL, the fine control signal FINE_CTRL, and the first coarse control signal COARSE_CTRL become a state 'L-L-H' or a state 'L-H-H'.

In response to the activated locking signal LOCK, the coarse delay operations of the coarse delay lines 110 and 120 are terminated and the fine delay operation of the phase mixing unit 130 is performed.

In accordance with the DLL circuit shown in FIGS. 2, 7, and 8, the second coarse control signal REVERSE_CTRL, the fine control signal FINE_CTRL, and the first coarse control signal COARSE_CTRL are detected at the same point of time, and this detection is determined as a locking point of time. Accordingly, a half phase locking failure does not occur although the feedback clock FB_CLK has a jitter component due to power noise.

Figure 10:
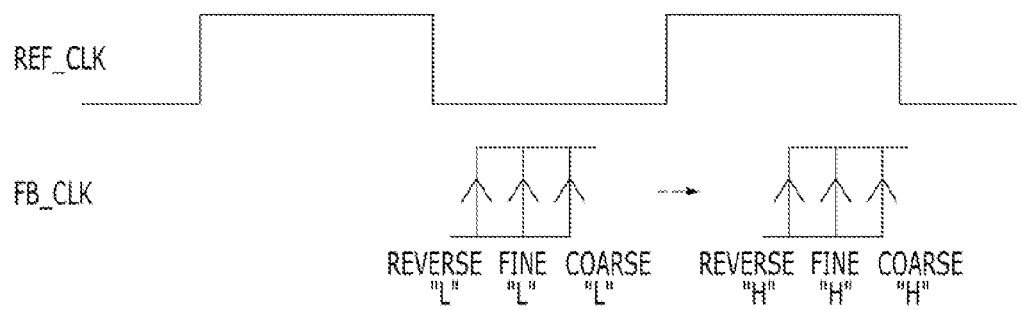
FIG. 10 is a waveform diagram illustrating concerns in the operation of the DLL circuit shown in FIGS. 2, 7, and 8.

As shown in FIG. 10, however, if the delay of the feedback clock FB_CLK is increased due to the introduction of power noise, a phase locking miss may be generated in which the states of the second coarse control signal REVERSE_CTRL, the fine control signal FINE_CTRL, and the first coarse control signal COARSE_CTRL transit from 'L-L-L' to 'H-H-H', thereby causing a malfunction of the DLL.

Figure 11:
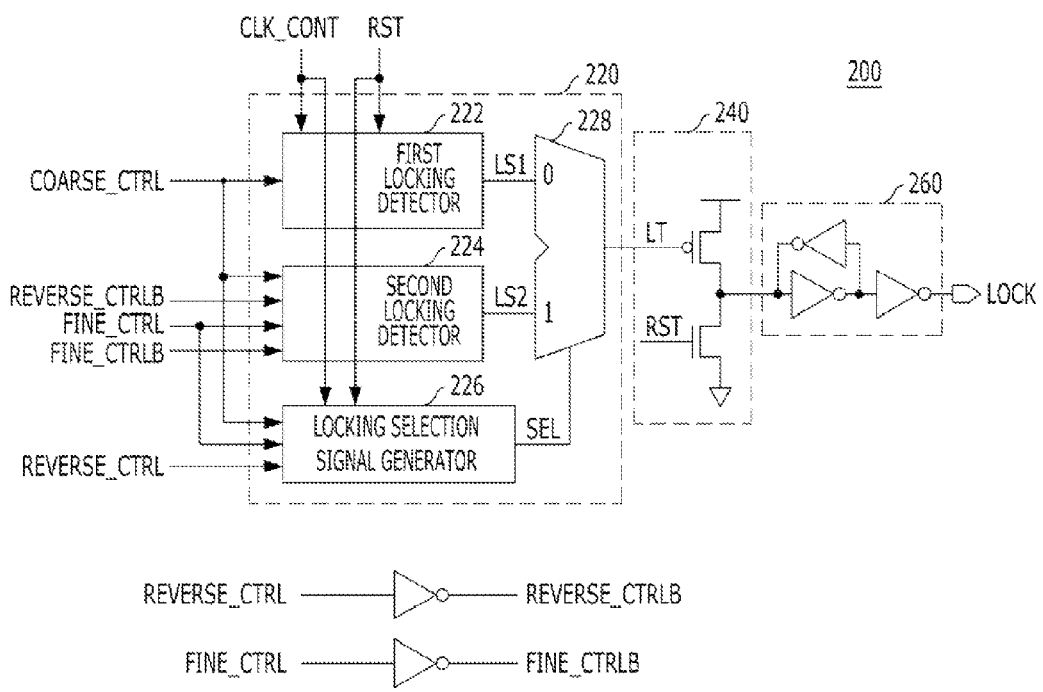
FIG. 11 is a block diagram of a coarse locking detection unit in accordance with an embodiment of the present invention.

FIG. 11 is a block diagram of a coarse locking detection unit in accordance with an embodiment of the present invention. For reference, a DLL circuit in accordance with an embodiment of the present invention has the same construction as the DLL circuit of FIG. 2 and includes the construction of the phase detection unit 170 shown in FIG. 7.

Referring to FIG. 11 the coarse locking detection unit 200 in accordance with an embodiment of the present invention includes a locking state detection unit 220, a signal driving unit 240 and a locking signal output unit 260.

The locking state detection unit 220 generates a locking state transfer signal LT in response to the fine control signal FINE_CTRL, the first coarse control signal COARSE_CTRL, and the second coarse control signal REVERSE_CTRL. The signal driving unit 240 outputs a signal that informs a locking state in response to the locking state transfer signal LT. The locking signal output unit 260 latches the signal outputted from the signal driving unit 240 and outputs the latched signal as the locking signal LOCK.

More particularly, the locking state detection unit 220 includes a first locking detector 222, a second locking detector 224, a locking selection signal generator 226, and a selector 228.

The first locking detector 222 compares the previous state and the current state of the first coarse control signal COARSE_CTRL with each other and outputs a first locking detection signal LS1 based on a result of the comparison. The second locking detector 224 outputs a second locking detection signal LS2 in response to a logic level of the fine control signal FINE_CTRL, the first coarse control signal COARSE_CTRL, and the second coarse control signal REVERSE_CTRL at the same time point. The locking selection signal generator 226 deactivates a selection signal SEL in a logic low level when the fine control signal FINE_CTRL, the first coarse control signal COARSE_CTRL, and the second coarse control signal REVERSE_CTRL falls in a specific condition and outputs the selection signal SEL of a logic low level. Here, the specific condition means a condition that the phase locking miss shown in FIGS. 7 to 10 may occur. In short, a condition that the second coarse control signal REVERSE_CTRL, the fine control signal FINE_CTRL, and the first coarse control signal COARSE_CTRL become a state 'L-L-L'. The selector 228 selects one of the first locking detection signal LS1 and the second locking signal LS2 in response to the selection signal SEL and outputs the selected signal as the locking state transfer signal LT. Preferably, the selector 228 may be formed of a multiplexer having 2 inputs and 1 output.

The signal driving unit 240 drives the locking signal LOCK in response to the locking state transfer signal LT. For reference, the signal driving unit 240 may be reset by a reset signal RST for resetting a delay locked operation. Preferably, the signal driving unit 240 may include a first transistor and a second transistor. Here, the locking state transfer signal LT is inputted to a gate of the first transistor, and a drain and source path of the first transistor is coupled between a terminal for a power source voltage VDD and the output terminal of the locking signal LOCK. The reset signal RST is inputted to the gate of the second transistor, and a source and drain path of the second transistor is coupled between a terminal for a ground voltage VSS and the output terminal of the locking signal LOCK.

The locking signal output unit 260 latches the locking signal LOCK and outputs a latched signal.

Figure 12:
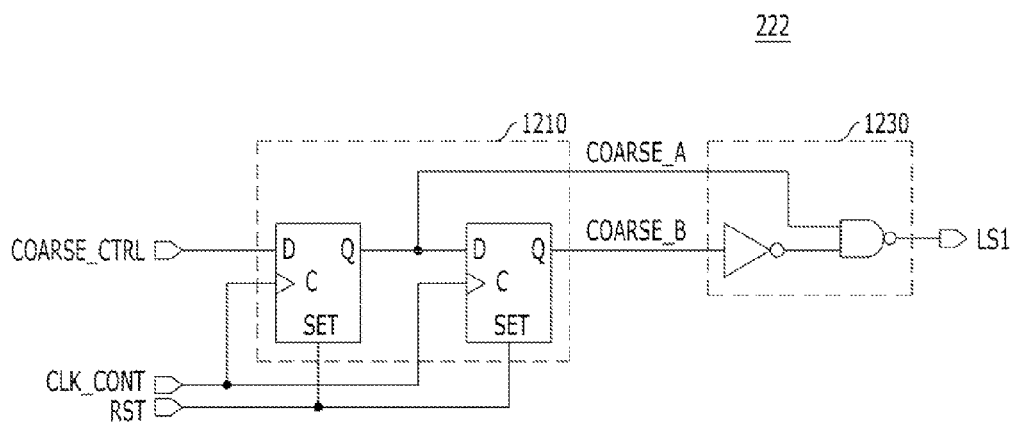
FIG. 12 is a detailed circuit diagram of a first locking detector shown in FIG. 11.

FIG. 12 is a detailed circuit diagram of the first locking detector 222 shown in FIG. 11.

Referring to FIG. 12, the first locking detector 222 includes a locking signal input unit 1210 and a first locking signal output unit 1230.

The locking signal input unit 1210 includes a first flip-flop 1212 and a second flip-flops 1214 configured to output the first coarse control signal COARSE_CTRL as a first coarse signal COAESE_A and a second coarse signal COARSE_B, which are synchronized with a clock signal CLK_CONT. For reference, the clock signal CLK_CONT is a clock obtained by dividing the external clock EXT_CLK by about 4 to 20 divisions and may be used to synchronize the control operation of the DLL circuit. The first and the second flip-flops 1212 and 1214 may be reset in response to the reset signal RST for resetting a delay locked operation.

The first locking signal output unit 1230 outputs the first locking detection signal LS1, informing a locking state, in response to the first and the second coarse signals COAESE_A and COARSE_B received from the locking signal input unit 1210.

Accordingly, the first locking detector 222 compares the previous state and the current state of the coarse control signal COARSE_CTRL with each other in response to the first coarse control signal COARSE_CTRL and generates the locking signal LOCK based on a result of the comparison, thus, being capable of informing a point of time at which a coarse delay operation will be terminated. Because the first locking detector 222 generates the first locking detection signal LS1 using only the previous state and the current state of the first coarse control signal COARSE_CTRL the first locking detector 222 is unable to generate the first locking detection signal LS1 by considering the jitter component of the reference clock REF_CLK, and a locking miss may not be caused in a phase-locked position.

Figure 13:
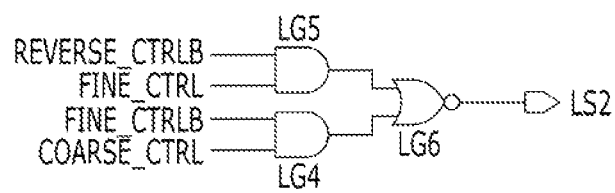
FIG. 13 is a detailed circuit diagram of a second locking detector shown in FIG. 11.

FIG. 13 is a detailed circuit diagram of the second locking detector 224 shown in FIG. 11.

Referring to FIG. 13, the second locking detector 224 includes a first logic gate LG4 for receiving an inverted fine control signal FINE_CTRLB and the first coarse control signal COARSE_CTRL, a second logic gate LG5 for receiving the fine control signal FINE_CTRL and an inverted second coarse control signal REVERSE_CTRLB, and a third logic gate LG6 for outputting the second locking detection signal LS2 by performing logic operation on the outputs of the first logic gate LG4 and the second logic gate LG5. Preferably, each of the first and the second logic gates LG4 and LG5 may be formed of an AND gate, and the third logic gate LG6 may be formed of a NOR gate.

The second locking detector 224 activates the second locking detection signal LS2 in response to the logic levels of the first coarse control signal COARSE_CTRL and the second coarse control signal REVERSE_CTRL, which correspond to a logic level of the fine control signal FINE_CTRL. Accordingly, the coarse locking detection unit 200 may inform a time point at which a coarse delay operation will be terminated by generating the second locking detection signal LS2 that corresponds to a logic level at the same point of time of the fine control signal FINE_CTRL and the first and the second coarse control signal COARSE_CTRL and REVERSE_CTRL.

For reference, referring back to FIG. 7, the second phase comparison unit 177 receives the reference clock REF_CLK without changes and the delayed feedback clock FB_CLKD and compares the phases of the reference clock REF_CLK with the delayed feedback clock FB_CLKD. Accordingly, the second phase comparison unit 177 generates an effect in which the reference clock REF_CLK seems to have been relatively advanced. In other words, the reference clock REF_CLK may not be advanced, but there is an effect in which the feedback clock FB_CLK seems to have been advanced by delaying the reference clock REF_CLK. Accordingly, the second locking detector 224 activates the second locking detection signal LS2 in response to a logic level at the same point of time of the first coarse control signal COARSE_CTRL and the second coarse control signal REVERSE_CTRL. As a result, although a jitter component is included in the reference dock REF_CLK, the moment the reference clock REF_CLK transits may be precisely detected.

Figure 14:
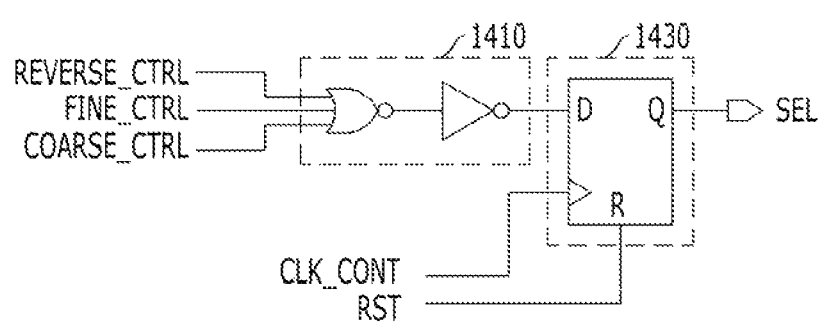
FIG. 14 is a detailed circuit diagram of a locking selection signal generator shown in FIG. 11.

FIG. 14 is a detailed circuit diagram of the locking selection signal generator shown in FIG. 11.

Referring to FIG. 14, the locking selection signal generator 226 includes a signal combination unit 1410 and a selection signal output unit 1430.

The signal combination unit 1410 combines the fine control signal FINE_CTRL and the first and the second coarse control signals COARSE_CTRL and REVERSE_CTRL. When any one of the fine control signal FINE_CTRL, the first coarse control signal COARSE_CTRL, and the second coarse control signal REVERSE_CTRL is activated, the signal combination unit 1410 outputs an output signal of a logic high level. When all the fine control signal FINE_CTRL and the first and the second coarse control signals COARSE_CTRL and REVERSE_CTRL are deactivated, the signal combination unit 1410 outputs the output signal of a logic low level. Preferably, the signal combination unit 1410 may be embodied using a combination of a NOR gate and an inverter or may be embodied using an OR gate.

The selection signal output unit 1430 outputs the output signal of the signal combination unit 1410 as the selection signal SEL, which is synchronized with the clock signal CLK_CONT. Preferably, the selection signal output unit 1430 may be embodied using a D-flip-flop, and the D-flip-flop may be reset in response to a reset signal RST for resetting a delay locked operation.

Figure 15:
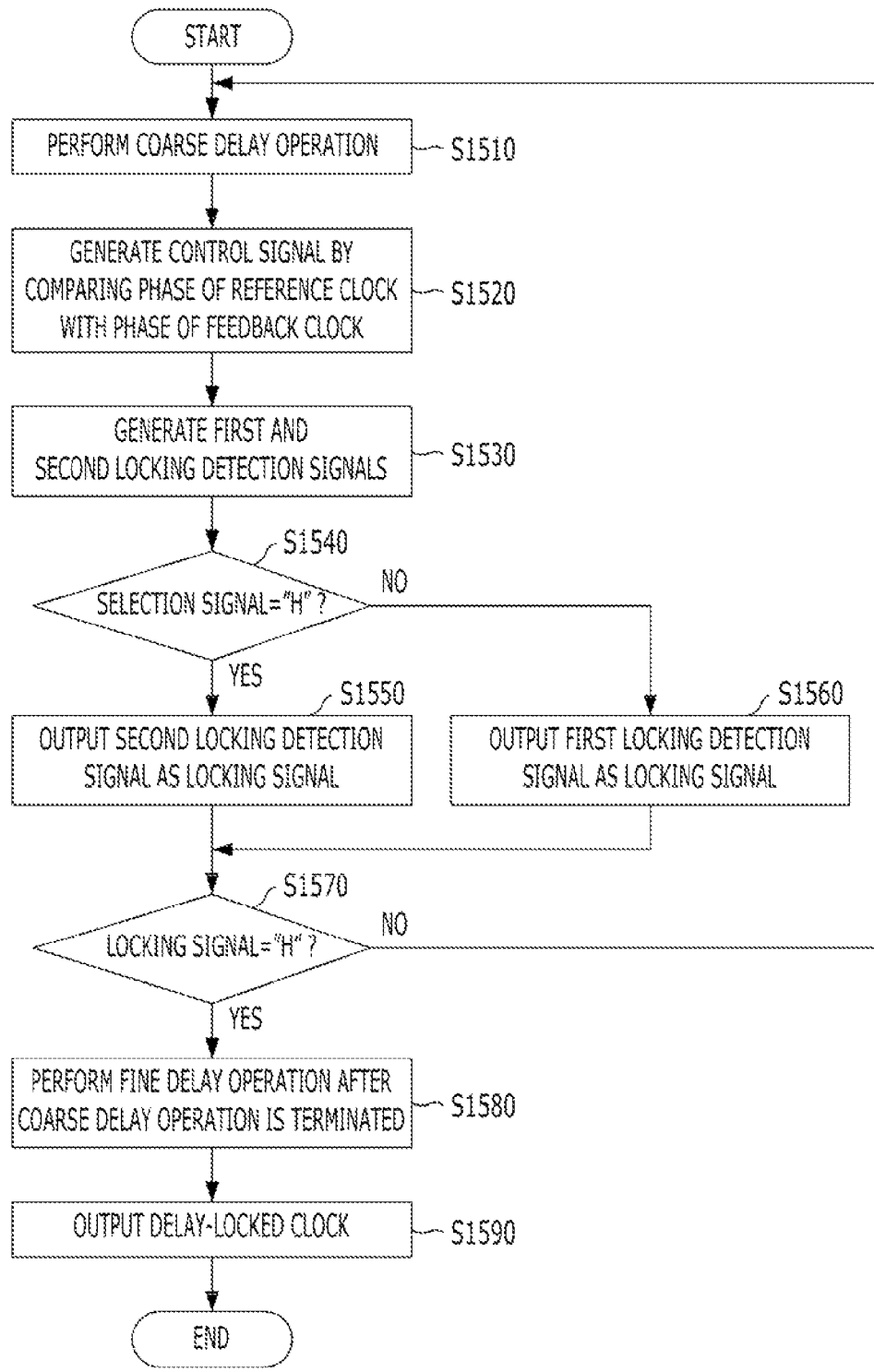
FIG. 15 is a flowchart illustrating a method of driving the DLL circuit in accordance with an embodiment of the present invention.

A method of driving the DLL circuit in accordance with an embodiment of the present invention is described below with reference to FIG. 15.

First, when the DLL circuit starts operating, at the early stage of the operation, the coarse delay lines 110 and 120 aligns the phases of the feedback clock FB_CLK and the reference clock REF_CLK by performing coarse delay operations so that the phase of the feedback clock FB_CLK is close to the phase of the reference clock REF_CLK at step S1510. At step S1520, the phase detection unit 170 compares the phase of the feedback clock FB_CLK with the phase of the reference clock REF_CLK and generates the fine control signal FINE_CTRL based on a result of the comparison. Furthermore, the phase detection unit 170 compares the phase of the delayed feedback clock FB_CLKD with the phase of the reference clock REF_CLK and generates the first coarse control signal COARSE_CTRL based on a result of the comparison. Furthermore, the phase detection unit 170 compares the phase of the delayed reference clock REF_CLKD with the phase of the feedback clock FB_CLK and generates the second coarse control signal REVERSE_CTRL based on a result of the comparison.

The coarse locking detection unit 200 generates one of the first locking detection signal LS1 and the second locking detection signal LS2 in response to the fine control signal FINE_CTRL and the first and the second coarse control signals COARSE_CTRL and REVERSE_CTRL at step S1530 and outputs the first locking detection signal LS1 or the second locking detection signal LS2 as the locking signal LOCK in response to the selection signal SEL at steps S1540 to S1560.

More particularly, the first locking detector 222 of the coarse locking detection unit 200 compares the previous state and the current state of the first coarse control signal COARSE_CTRL with each other and outputs the first locking detection signal LS1 based on a result of the comparison. The second locking detector 224 outputs the second locking detection signal LS2 in response to a logic level of the fine control signal FINE_CTRL, the first coarse control signal COARSE_CTRL, and the second coarse control signal REVERSE_CTRL at the same time point. The locking selection signal generator 226 outputs the selection signal SEL in response to the fine control signal FINE_CTRL, the first coarse control signal COARSE_CTRL, and the second coarse control signal REVERSE_CTRL. The selector 228 outputs one of the first locking detection signal LS1 and the second locking detection signal LS2 in response to the selection signal SEL and outputs the selected signal as the locking state transfer signal LT. The locking signal output unit 260 latches the locking state transfer signal LT and output a latched signal as the locking signal LOCK.

At the initial operation of the DLL circuit, the selection signal SEL is activated to a logic high level. Thus, the coarse locking detection unit 200 selects the second locking detection signal LS2 in response to the selection signal SEL of the logic high level and outputs the second locking detection signal LS2 as the locking signal LOCK at steps S1540 and S1550. If a condition that a phase locking miss will occur is satisfied, that is, when the selection signal SEL is deactivated to a logic low level in a condition that the second coarse control signal REVERSE_CTRL, the fine control signal FINE_CTRL, and the first coarse control signal COARSE_CTRL become a state 'L-L-L', the coarse locking detection unit 200 selects the first locking detection signal LS1 in response to the selection signal SEL of the logic low level and outputs the first locking detection signal LS1 as the locking signal LOCK at steps S1540 and S1560.

The steps S1510 to S1560 are repeated until the phase of the feedback clock FB_CLK is close to the phase of the reference clock REF_CLK, and thus, the locking signal LOCK is activated in a logic high level.

When the locking signal LOCK is activated in a logic high level, the coarse delay operations of the coarse delay lines 110 and 120 are terminated and the fine delay operation of the phase mixing unit 130 is performed to align the phases of the feedback clock FB_CLK and the reference clock REF_CLK at step S1580. Next, the clock driver 140 outputs the delay locked clocks RCLK_DLL and FCLK_DLL in response to the signal received from the phase mixing unit 130 at step S1590. As described above, in accordance with the exemplary embodiments of the present invention, the coarse locking detection unit generates the first locking detection signal LS1 using a method that may prevent a locking miss from occurring in a delay locked position without incorporating a jitter component into the method. The coarse locking detection unit also generates the second locking detection signal LS2 using a method that may prevent a half phase locking failure from occurring by incorporating a jitter component into the method. Furthermore, the coarse locking detection unit outputs the second locking detection signal in an initial operation section, but outputs the first locking detection signal when a logical combination of the first and the second phase detection signals satisfies a specific condition, that is, a condition that a phase locking miss will occur.

Accordingly, the DLL circuit in accordance with the exemplary embodiments may prevent the locking signal from being erroneously activated due to the introduction of noise resulting from a shift in a power source voltage in an initial locking process by improving a half phase locking failure. Furthermore, the DLL circuit in accordance with the exemplary embodiments may prevent malfunction that causes a locking miss in a phase-locked position.

Furthermore, in the present invention the locking detection unit capable of improving a half phase locking failure in the initial locking process of the DLL circuit and the locking detection unit capable of solving a phase locking miss in which delay locking is missed in the phase-locked position are selectively used. Accordingly, there is an advantage in that the DLL circuit using a coarse delay and a fine delay may provide a reliable delay locked clock without error.

While the present invention has been described with respect to the specific embodiments, it will be apparent to those skilled in the art that various changes and modifications may be made without departing from the spirit and scope of the invention as defined in the following claims.

What is claimed is:

1. A delay locked loop comprising:
   a coarse delay line configured to have a plurality of unit delays and delay an reference clock to output a delayed clock;
   a phase mixing unit configured to delay the delayed clock to output a delayed output clock;
   a replica delay unit configured to delay the delayed output clock by an expected modeling value to output a feedback clock;
   a phase detection unit configured to compare a phase of the feedback clock with a phase of the reference clock to generate a first phase detection signal based on a result of the comparison, compare the phase of the reference clock with a phase of the feedback clock delayed by a unit delay amount of each unit delay of the coarse delay line to generate a second phase detection signal based on a result of the comparison, and compare the phase of the reference clock with a phase of the feedback clock advanced by the unit delay amount to generate a third phase detection signal based on a result of the comparison;
   a locking detection unit configured to output a locking signal by selecting a first locking detection signal generated by comparing a previous state and a current state of the second phase detection signal with each other or a second locking detection signal generated in response to logic levels of the first to third phase detection signals at the same timing; and
   a control unit configured to control the coarse delay line and the phase mixing unit in response to the locking signal and the first phase detection signal.

2. The delay locked loop of claim 1, wherein the phase detection unit comprises:
   a first unit delay configured to delay the feedback clock by the unit delay amount and output a delayed feedback clock;

a second unit delay configured to delay the reference clock by the unit delay amount and output a delayed reference clock;

a first phase comparison unit configured to compare the phase of the feedback clock with the phase of the reference clock to output the first phase detection signal based on a result of the comparison;

a second phase comparison unit configured to compare the phase of the reference clock with a phase of the delayed feedback clock to output the second phase detection signal based on a result of the comparison; and a third phase comparison unit configured to compare the phase of the feedback clock with a phase of the delayed reference clock to output the third phase detection signal based on a result of the comparison.

3. The delay locked loop of claim 1, wherein the locking detection unit comprises:

a first locking detector configured to compare the previous state and the current state of the second phase detection signal to output the first locking detection signal based on a result of the comparison;

a second locking detector configured to output the second locking detection signal in response to logic levels of the second and the third phase detection signals;

a locking selection signal generator configured to output a selection signal when a logical combination of the first to third phase detection signals falls in a specific condition; and a selector configured to select the first locking detection signal or the second locking detection signal in response to the selection signal.

4. The delay locked loop of claim 3, wherein the locking detection unit further comprises:

a signal driving unit configured to drive an output signal of the selector; and a locking signal output unit configured to latch an output signal of the signal driving unit to output the latched signal as the locking signal.

5. The delay locked loop of claim 3, wherein the first locking detector comprises:

a locking signal input unit configured to output first and second coarse signals by synchronizing the second phase detection signal with a clock signal; and a first locking signal output unit configured to compare the first and the second coarse signals with each other to output the first locking detection signal based on a result of the comparison.

6. The delay locked loop of claim 5, wherein the locking signal input unit comprises:

a first flip-flop configured to output the first coarse signal by synchronizing the second phase detection signal with the clock signal; and a second flip-flop configured to output the second coarse signal by synchronizing the first coarse signal with the clock signal.

7. The delay locked loop of claim 3, wherein the second locking detector comprises:

a first logic gate configured to receive an inverted signal of the first phase detection signal and the second phase detection signal;

a second logic gate configured to receive the first phase detection signal and an inverted signal of the third phase detection signal; and a third logic gate configured to output the second locking detection signal by performing a logic operation on outputs of the first logic gate and the second logic gate.

8. The delay locked loop of claim 7, wherein each of the first and the second logic gates comprises an AND gate, and the third logic gate comprises a NOR gate.

9. The delay locked loop of claim 3, wherein the locking selection signal generator receives the first to third phase detection signals, and outputs the selection signal of a first logic level when any one of the first to third phase detection signals is activated while outputting the selection signal of a second logic level when all the first to third phase detection signals are deactivated.

10. The delay locked loop of claim 3, wherein the locking selection signal generator comprises:

a signal combination unit configured to receive the first to third phase detection signals, and output an output signal of a first logic level when any one of the first to third phase detection signals is activated while outputting the output signal of a second logic level when all the first to third phase detection signals are deactivated; and a selection signal output unit configured to output the selection signal by synchronizing the output of the signal combination unit with the clock signal.

11. The delay locked loop of claim 10, wherein the signal combination unit comprises a combination of a NOR gate and an inverter or an OR gate.

12. The delay locked loop of claim 10, wherein the selection signal output unit comprises a D-flip-flop.

13. The delay locked loop of claim 3, wherein the selector comprises a multiplexer.

14. The delay locked loop of claim 1, further comprising:

a clock input unit configured to receive an external clock to output the reference clock; and a clock driver configured to output the delayed output clock as a delay locked loop clock to a data output circuit.

15. A delay locked loop, comprising:

a variable delay unit configured to comprise a plurality of unit delays to delay a reference clock;

a replica delay unit configured to delay an output clock of the variable delay unit by an expected modeling value to output a feedback clock;

a first phase detection unit configured to compare a phase of the reference clock with a phase of the feedback clock to generate a first phase detection signal based on a result of the comparison;

a second phase detection unit configured to compare the phase of the reference clock with a phase of the feedback clock delayed by a unit delay of the variable delay unit to generate a second phase detection signal according to a result of the comparison;

a third phase detection unit configured to compare a phase of the reference clock delayed by the unit delay with the phase of the feedback clock to generate a third phase detection signal based on a result of the comparison;

a first locking detection unit configured to generate a first locking detection signal by detecting a transition of the second phase detection signal;

a second locking detection unit configured to generate a second locking detection signal in response to logic levels of the second and the third phase detection signals corresponding to a logic level of the first phase detection signal;

a selection unit configured to output the first locking detection signal or the second locking detection signal as a final locking signal in response to a selection signal generated when the first to third phase detection signals satisfy a specific condition; and a delay control unit configured to control an amount of delay of the variable delay unit in response to the final locking signal and the first phase detection signal.

16. The delay locked loop of claim 15, further comprising:
a selection signal generation unit configured to output the selection signal of a first logic level when any one of the first to third phase detection signals is activated while outputting the selection signal of a second logic level when all the first to third phase detection signals is deactivated.

17. A method of driving a delay locked loop, comprising:
delaying an reference clock by a coarse delay amount;
delaying the delayed reference clock by a fine delay amount to output an output clock;
delaying the output clock by an expected modeling value to output a feedback clock;
comparing a phase of the reference clock with a phase of the feedback clock to generate a first phase detection signal based on a result of the comparison, comparing the phase of the reference clock with a phase of the feedback clock delayed by a unit delay amount of the coarse delaying to generate a second phase detection signal based on a result of the comparison, and comparing the phase of the reference clock with a phase of the feedback clock advanced by the unit delay amount of the coarse delaying to generate a third phase detection signal based on a result of the comparison;
generating a first locking detection signal by detecting a transition of the second phase detection signal, and generating a second locking detection in response to logic levels of the second and the third phase detection signals;
selecting one of the first locking detection signal and the second locking detection signal in response to a selection signal to output a locking signal; and
controlling delay amounts of the coarse and fine delays in response to the locking signal and the first phase detection signal.

18. The method of claim 17, wherein the generating of the first and second locking detection signal comprises:
comparing a previous state and a current state of the second phase detection signal to output the first locking detection signal based on a result of the comparison; and
outputting the second locking detection signal in response to a logic level the first to third phase detection signals at a same time.

19. The method of claim 18, further comprising:
outputting the selection signal when a logical combination of the first to third phase detection signals satisfies a specific condition.

20. The method of claim 19, wherein the outputting of the selection signal comprises:
receiving the first to third phase detection signals;
outputting the selection signal of a first logic level when one of the first to third phase detection signals is activated; and
outputting the selection signal of a second logic level when all the first to third phase detection signals are deactivated.

* * * * *